United States Patent [19]

Nishizawa

[11] Patent Number: 4,668,306
[45] Date of Patent: May 26, 1987

[54] METHOD OF MANUFACTURING A SEMICONDUCTOR DEVICE HAVING UNHOMOGENEOUS DISTRIBUTION OF IMPURITY CONCENTRATION

[75] Inventor: Jun-ichi Nishizawa, Sendai, Japan

[73] Assignee: Zaidan Hojin Handotai Kenkyu Shinkokai, Sendai, Japan

[21] Appl. No.: 737,089

[22] Filed: May 23, 1985

[30] Foreign Application Priority Data

May 28, 1984 [JP] Japan .................. 59-107730

[51] Int. Cl.⁴ .......................................... H01L 21/324
[52] U.S. Cl. ...................................... 148/1.5; 148/171; 148/175; 148/188; 29/569 L; 29/576 E
[58] Field of Search ............... 148/1.5, 171, 175, 188; 29/569 L, 576 E

[56] References Cited

U.S. PATENT DOCUMENTS

| | | | |
|---|---|---|---|
| 4,190,486 | 2/1980 | Kyle | 148/171 X |
| 4,389,256 | 6/1983 | Nishizawa et al. | 29/569 L |
| 4,481,041 | 11/1984 | Muller | 148/1.5 |
| 4,489,480 | 12/1984 | Martin et al. | 148/1.5 X |
| 4,499,656 | 2/1985 | Fabian et al. | 29/576 E |
| 4,505,765 | 3/1985 | Trommer | 29/576 E |
| 4,526,632 | 7/1985 | Nishizawa et al. | 148/171 |
| 4,540,451 | 9/1985 | Leibenzeder et al. | 29/569 L |
| 4,544,417 | 10/1985 | Clarke et al. | 148/1.5 |
| 4,559,091 | 12/1985 | Allen et al. | 29/576 E |
| 4,576,652 | 3/1986 | Hovel et al. | 148/1.5 |

FOREIGN PATENT DOCUMENTS 52-128057 10/1977 Japan .

OTHER PUBLICATIONS

Nikura et al., *Electronics Letters,* vol. 14, No. 1, Jan. 5, 1978, pp. 9 and 10.

*Primary Examiner*—George T. Ozaki
*Attorney, Agent, or Firm*—Cushman, Darby & Cushman

[57] ABSTRACT

A semiconductor device having an uneven distribution of impurity concentration is manufactured easily and with good reproducibility from a wafer of a Group III-V or Group II-VI compound semiconductor by first forming a thin layer of impurity in a desired region of a principal surface of the wafer by, for example, an ion-implantation technique, and then subjecting the wafer to heat treatment under a controlled vapor pressure of at least one of the component elements of the compound semiconductor in order to maintain the stoichiometric composition of the impurity layer.

3 Claims, 10 Drawing Figures

METHOD OF MANUFACTURING A SEMICONDUCTOR DEVICE HAVING UNHOMOGENEOUS DISTRIBUTION OF IMPURITY CONCENTRATION

BACKGROUND OF THE INVENTION

1. Field of the Invention

The present invention relates to a method of manufacturing a semiconductor device and, in particular, a semiconductor device having an unhomogeneous distribution of impurity concentration.

2. Description of the Prior Art

It is well known that silicon varactor diodes having a hyper-abrupt junction may be easily manufactured by using an alloying diffusion technique. In the case of a varactor diode made with a compound semiconductor such as GaAs, however, it is not possible to perform a satisfactory diffusion of, for example, the donor atoms. This in turn makes it difficult to obtain a varactor diode having a large variation of capacitance relative to the applied voltage. In the past, attempts have been made to produce hyper-abrupt junctions in GaAs varactor diodes by using either an ion-implantation technique or a molecular beam epitaxial growth technique. Use of each of these techniques, however, entails certain disadvantages. In the case of the former technique, it is difficult to carry out the step of annealing which follows ion-implanation and in the case of the latter technique, difficulty is encountered during the doping process.

Japanese Patent Preliminary Publication No. Sho 52-128057 discloses a method including the ion-implantation of sulfur (S), which utilizes the abnormal diffusion phenomenon of sulfur (S) to obtain an impurity concentration distribution, with an impurity level variation ranging from 1.5 to 4. According to this method, an insulating film which serves as the protective film is deposited onto the opposing surfaces of the GaAs wafer during the annealing step which follows the ion-implantation of sulfur (S). The method described by this publication, however, is accompanied by a significant drawback in that it is not possible to eliminate the abnormal diffusion of sulfur (S) at the time of annealing.

SUMMARY OF THE INVENTION

It is, therefore, a primary object of the present invention to provide a method of obtaining, easily and with good reproducibility, a varactor diode which is made of a compound semiconductor such as GaAs and which has a good hyper-abrupt junction.

Another object of the present invention is to provide a method of manufacturing a semiconductor device, which method makes it possible to obtain, easily and with good reproducibility, a desired unhomogeneous distribution of impurity concentration in the device without being accompanied by an abnormal diffusion of the dopant.

A further object of the present invention is to provide a method of manufacturing, with a simplified process, a semiconductor device having an unhomogeneous distribution of impurity concentration.

These and other objects of the present invention will become more apparent during the course of the following detailed description and appended claims.

DETAILED DESCRIPTION OF THE PREFERRED EMBODIMENT

The present invention will hereinafter be described in further detail by referring to the accompanying drawings.

Figure 1A:
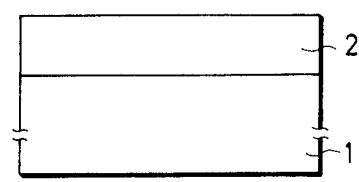
FIGS. 1A to 1F illustrate the steps according to which an embodiment of the semiconductor device is manufactured according to the method of the present invention.

In FIG. 1A, reference numeral 1 represents an n+GaAs substrate (wafer); reference numeral 2 represents an epitaxial growth layer formed on top of the substrate 1 which layer has an impurity concentration on the order of, for example, $1 \times 10^{16}$ cm$^{-3} \sim 1 \times 10^{17}$ cm$^{-3}$, and a thickness of about $0.2 \sim 1$ $\mu$m. Using an ion-implantation technique, a dose of sulfur (S) is introduced as an n type impurity into a desired area of the epitaxial layer of a GaAs wafer, either entirely or locally as required. In FIG. 1B, reference numeral 3 represents an ion-implanted layer. Following the ion-implantation of sulfur (S) into the desired area of the expitaxial layer of the GaAs wafer, the wafer is enclosed, along with As, in a quartz tube, and after evacuation of the air therefrom, the tube is sealed off from the external atmosphere by using a known oxygen-hydrogen torch. Next, while keeping the interior of the tube under an As vapor pressure in order to maintain the stoichiometric composition of the impurity-implanted layer of the wafer, the contents of the tube are subjected to heat treatment. In FIG. 1C, reference numeral 4 represents a region which is formed as the sulfur (S) which has been implanted in the surface of the wafer diffuses into the interior of the epitaxial growth layer 2. Then, a Schottky barrier of planar type is formed by relying on a known technique. More particularly, as shown in FIG. 1D, an insulating layer 10 of a material such as $SiO_2$, $Si_3N_4$ or the like is formed on the surface of the region 4 which has been formed by the diffusion of sulfur (S) into the interior of the epitaxial growth layer 2 following heat treatment. The insulating layer 10 is formed using the plasma CVD technique or a like technique, and openings are provided there by a photo-etching technique.

Figure 1E:
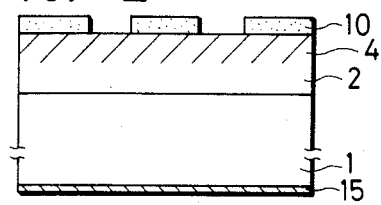
Figure 1B:
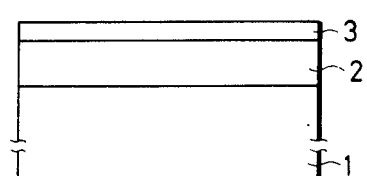

Next, as shown in FIG. 1E, an ohmic contact 15 is formed at the bottom of the n+type substrate 1. More particularly, following the vacuum-deposition of Au-Ge (containing about 12 weight percent of Ge) and Ni, each to a depth of 1000 Å at the bottom of the substrate 1, the resulting wafer is subjected to heat treatment in $H_2$ gas at 450° C. for 1 to 2 minutes, thereby forming a good ohmic contact 15.

Figure 1F:
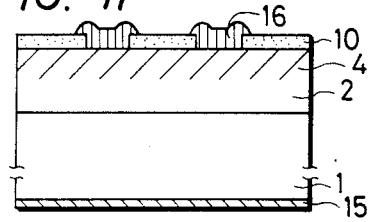
Figure 1C:
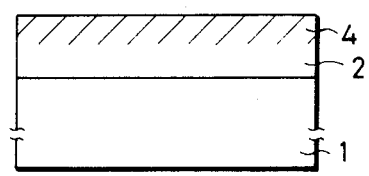
Figure 1D:
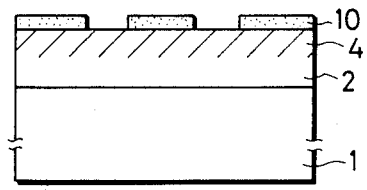

Finally, a metal such as Al, Ni, Pt, Au or Ti is selectively deposited onto the surface of the openings of the wafer, as shown in FIG. 1F, to provide Schottky electrodes 16.

It may be seen that after the ion-implantation of an impurity into the wafer, heat treatment of the wafer carrying the impurity-implanted layer is performed while applying a controlled vapor pressure of at least one of the component elements constituting the compound semiconductor (which in the present case is As) in such a way that said layer of said wafer maintains the stoichiometric composition of GaAs, as described above in connection with FIG. 1C. It should be understood that FIGS. 2A and 2B show an example of this purpose.

Figure 2A:
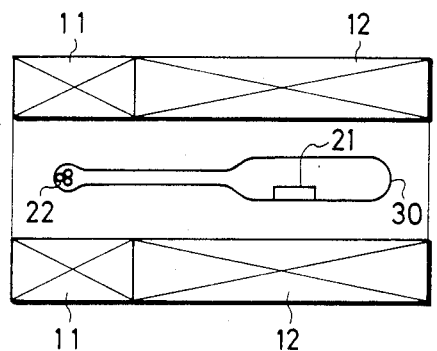
FIGS. 2A and 2B illustrate the heat-treatment step according to the method of the present invention.
Figure 2B:
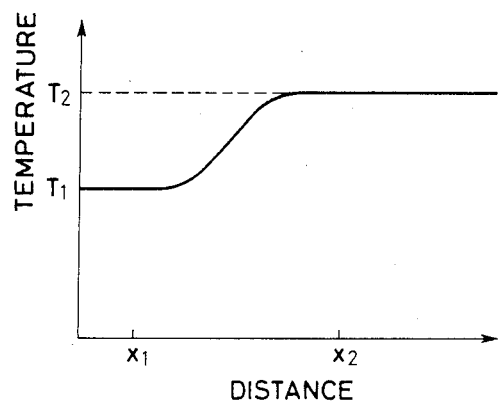

More particularly, in FIG. 2A, reference numeral 30 represents a quartz tube in which a wafer 21 and an amount of As 22 are enclosed. Numerals 11 and 12 represent electric furnaces for performing heat treatment in two zones. The furnace located at zone 11 is used to control the As vapor pressure, whereas furnace 12 heats the wafer contained in the tube. FIG. 2B shows the temperature distribution in the two electric furnace zones 11 and 12, respectively. In the figure, symbol $x_1$ represents the location of As 22, while symbol $x_2$ represents that of the wafer 21. Symbols $T_1$ and $T_2$ represent the temperatures at locations $x_1$ and $x_2$, respectively.

In the above-described example, a GaAs substrate which has been implanted with sulfur (S) is subjected to heat treatment at $T_1 = 495°$ C. and $T_2 = 800°$ C. for 30 minutes.

Under the above-described heat treatment, and under an applied As vapor pressure set at a value of $P \simeq 2.6 \times 10^{-6} (-1.05/kT)$ Torr, a wafer having a satisfactory surface condition is obtained. In this example, the symbol k represents Boltzmann's constant, and the symbol T represents an absolute temperature.

Figure 3:
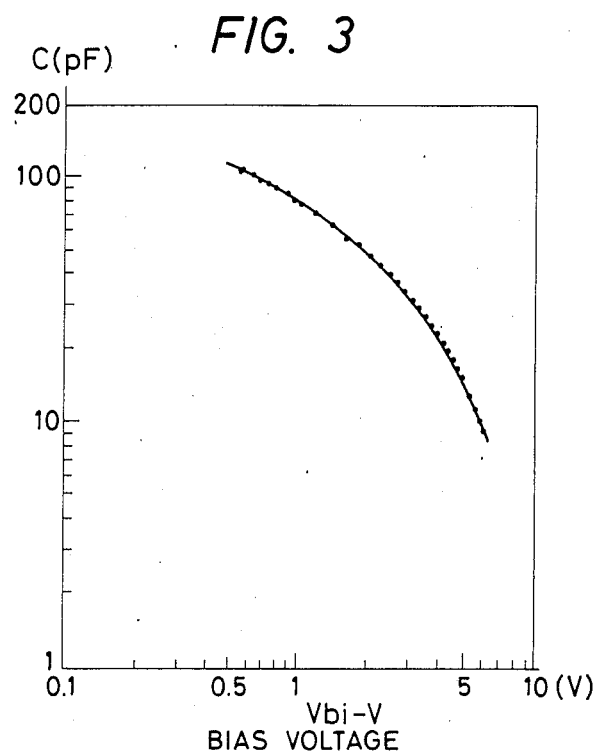
FIG. 3 is a chart showing the C-V (capacitance vs. voltage) characteristics of a Schottky barrier diode manufactured according to the method of the present invention.

FIG. 3 shows an example of the C-V (capacitance vs. voltage) characteristics of the varactor diodes manufactured in the manner of the present invention as described above. It should be understood that Ni is used as the material of the Schottky electrode.

In the above example, ion-implantation is carried out in such a way that sulfur (S) is introduced at a dose of $2 \times 10^{13}/cm^2$ and at an accelerated voltage of 80 keV. In FIG. 3, the horizontal axis represents $V_{bi}$-V. According to this example, $V_{bi}$ denotes a diffusion potential which is about 0.9 eV. Regarding the C-V characteristics of the produced device, the capacitance of the Schottky diode is noted to be 80 pF at zero biasing, and 8 pF when reverse-biased at $-5$ V, so that the capacitance variation is found to be 10.

Figure 4:
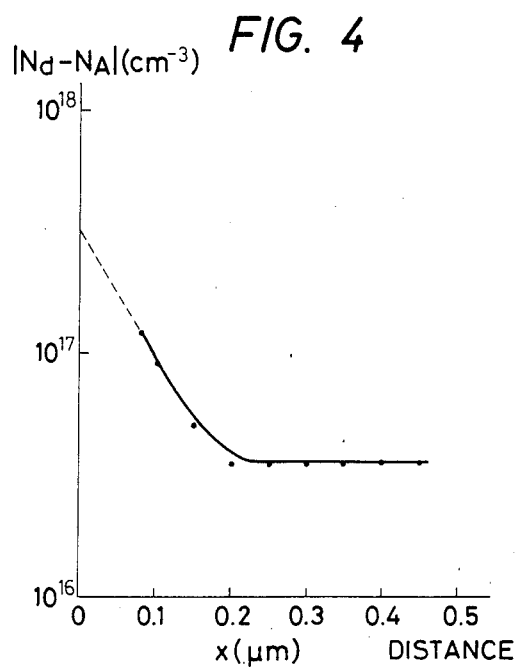
FIG. 4 is a chart showing the distribution of the impurity concentration in the Schottky barrier diode manufactured according to the method of the present invention.

FIG. 4 shows the distribution of the impurity concentration of the diode manufactured according to the method of the present invention, which distribution is determined by measuring the C-V characteristics of the diode. As is apparent from FIG. 4, the impurity concentration distribution of this device fits the following formula well:

$$N(x) = N^{(-x/L)} + N_b$$

wherein:
N(x) represents the impurity concentration at x; the surface of the Schottky barrier junction;
$N_b$ represents the impurity concentration of the epitaxial layer; and
L represents the diffusion length.
In this example, N is $3 \times 10^{17}$ cm$^{-3}$; L is 730 Å; and $N_b$ is $3.5 \times 10^{16}$ cm$^{-3}$. It has been found that the diffusion length L assumes a value in the range of 500 Å to 800 Å in the diodes manufactured. Thus, the formation of a desirable hyper-abrupt junction is confirmed. In addition, it has been noted that the diodes manufactured according to the method of the present invention unanimously exhibit good I-V (current-to-voltage) characteristics, as well as a reverse hard breakdown voltage of 10-15 V.

The diode which has a junction diameter of 10 μm and which is manufactured according to the method of the present invention is mounted in a waveguide package. The packaged diode is then inserted in a frequency multiplier circuit wherein the operating frequency is doubled from 25 GHz to 50 GHz. A multiplication dissipation of 12 dB is noted, confirming that this diode operates satisfactorily as a varactor diode in the millimeter-wave band. The cut-off frequency of the diode at zero biasing is calculated to be 1000 GHz or higher.

The above-described tests performed on semiconductor devices which are manufactured according to the method of the present invention and which utilize sulfur (S) to form a thin layer of impurity confirm that no development of abnormal diffusion of the impurity occurs, and that diodes having very large variations of capacitance and having good millimeter wave characteristics are obtained.

In connection with the above-mentioned embodiment, it should be noted that the method of manufacturing diodes according to the present invention is not limited to the manufacture of planar diodes alone, but that it may be applied equally effectively to the manufacture of beam-lead type diodes, and further that the semiconductor material employed according to the method of the present invention is not limited to Group III-V compound semiconductors such as GaAs, InP, GaP and $Ga_{1-x}Al_xAs$, but that Group II-VI compound semiconductors such as ZnSe, $Hg_{1-x}Cd_xTe$ and HgTe may also be easily used.

It should be noted as well that the type of ion which may be implanted into the wafer is not limited to sulfur (S), but that any type of ion may be used so long as it serves as an impurity for Group III-V compound semiconductors. Furthermore, the vapor pressure source supplied for the heat treatment which follows ion-implantation is not limited to Group V atoms, but any compound containing Group V atoms may be used. Of course, when the compound semiconductor is a Group II-VI compound semiconductor, a Group II or VI impurity is introduced.

The heat treatment step which follows ion-implantation is performed using the closed-tube technique as shown in FIG. 2, according to one embodiment of the present invention. However, in the event that such treatment leads to poor productivity in the resultant semiconductor device, the heat treatment may be performed in such a way that an evacuator means is attached to an open end of an open-tube unit so that, after air in the tube has been evacuated, the tube is closed with a valve means, and thereafter the heat treatment may be performed while applying thereinto a controlled As vapor pressure.

It should be noted further that, for the purpose of obtaining an unhomogeneous distribution of impurity concentration, the employment of an ion-implantation technique as one of the manufacturing steps is not always necessary, but the same result may be obtained if an insulating thin layer containing impurity atoms is formed on top of the epitaxial growth layer, or a thin film of either a single crystal or a polycrystal containing an impurity is formed on top of the epitaxial layer.

There has been described above an embodiment of the present invention, wherein a hyper-abrupt junction is produced in order to provide an unhomogeneous distribution of impurity concentration in a varactor diode. However, the method of the present invention is not limited to the manufacture of varactor diodes alone, but the method may be applied equally effectively to the manufacture of compound semiconductor devices such as transistors and negative resistance diodes.

As discussed above, according to the method of the present invention, there is no need to cover the surface of the semiconductor substrate with an insulating film of, for example, $SiO_2$ or $Si_3N_4$ at the time of the heat treatment which follows ion-implantation. Thus, the present invention has many advantages including simplification of the entire manufacturing process, and since heat treatment is performed while applying a controlled vapor pressure of at least one of the component elements constituting the compound semiconductor to the wafer so as to maintain the stoichiometric composition of the wafer while controlling the duration of the heat treatment, a desired unhomogeneous distribution of an impurity concentration may be obtained easily and with good reproducibility and without being accompanied by an abnormal diffusion of the impurity.

What is claimed is:

1. A method of manufacturing a varactor diode of a compound semiconductor, comprising the steps of;

forming a conductive type growth layer of a higher resistivity on the surface of a conductive type semiconductor wafer of low resistivity;

doping a conductive type impurity onto the surface of said growth layer by an ion-implanation technique;

enclosing the resulting wafer and at least one of the more volatile component elements constituting the compound semiconductor in a closed tube to house said resulting wafer and said at least one element in a two-zone electric furnace and subjecting said resulting wafer to heat-treatment under an optimum vapor pressure of said at least one element to keep a stoichiometric composition;

forming an insulating layer on a principal surface of said growth layer of said resulting wafer by using a coating formation technique relying on a plasma chemical vapor deposition method;

providing openings in predetermined regions of said insulating layer by using a photolithography technique;

forming an ohmic electrode on the bottom surface of said resulting wafer; and forming metal layers for Schottky barrier in said opening regions.

2. A method according to claim 1, wherein:

said compound semiconductor is GaAs, said at least one element for applying vapor pressure is As, said impurity to be ion-implanted is sulfur (S), and said vapor pressure of As is set at a value of approximately $2.6 \times 10^{-6} (-1.05/kT)$ Torr.

3. A method according to claim 1, wherein:

said compound semiconductor is a Group III-V compound semiconductor and said at least one element for applying vapor pressure is a Group V element.

* * * * *